United States Patent [19]

Ohuchi et al.

[11] Patent Number: 4,968,665

[45] Date of Patent: Nov. 6, 1990

[54] TARGET USED FOR FORMATION OF SUPERCONDUCTIVE OXIDE FILM, PROCESS OF PRODUCING THEREOF, AND PROCESS OF FORMING SUPERCONDUCTIVE OXIDE FILM ON SUBSTRATE USING THE SAME

[75] Inventors: Yukihiro Ohuchi; Tadashi Sugihara; Takuo Takeshita, all of Saitama, Japan

[73] Assignee: Mitsubishi Metal Corporation, Tokyo, Japan

[21] Appl. No.: 363,010

[22] Filed: Jun. 8, 1989

[30] Foreign Application Priority Data

Feb. 10, 1989 [JP] Japan .................................. 1-31911

[51] Int. Cl.⁵ ...................... C23C 14/08; C23C 14/34
[52] U.S. Cl. .................................... 505/1; 204/192.24; 204/298.13; 505/731; 505/736
[58] Field of Search ................... 204/192.24, 298 TC; 505/731, 736, 739, 816, 1

[56] References Cited

U.S. PATENT DOCUMENTS 4,866,032 9/1989 Fujimori et al. ........................ 505/1

FOREIGN PATENT DOCUMENTS 307111 12/1988 Japan .
313427 12/1988 Japan .
  4466 1/1989 Japan .

OTHER PUBLICATIONS

Ken'ichi Kuroda et al., Japanese Journal of Applied Physics, vol. 28, No. 9, pp. 1586–1592, (1989).

Primary Examiner—G. L. Kaplan
Attorney, Agent, or Firm—Sughrue, Mion, Zinn, Macpeak & Seas

[57] ABSTRACT

A target for forming a superconductive oxide film consists of 5 to 40% by volume of metallic copper and 60 to 95% by volume of an oxygen compound of barium and copper, strontium, calcium and copper, or barium, calcium and copper dispersed in the metallic copper, and the target is improved in thermal conductivity, electric resistivity and mechanical strength, because the metallic copper is large in those properties.

20 Claims, 2 Drawing Sheets

TARGET USED FOR FORMATION OF SUPERCONDUCTIVE OXIDE FILM, PROCESS OF PRODUCING THEREOF, AND PROCESS OF FORMING SUPERCONDUCTIVE OXIDE FILM ON SUBSTRATE USING THE SAME

FIELD OF THE INVENTION

The present invention relates to a target used for forming a superconductive oxide film on a substrate by using a co-sputtering technique, a process for producing the same, and a process of forming a superconductive oxide film on a substrate by using the same.

BACKGROUND OF THE INVENTION

Recently, attempts have been made to form superconductive oxide films in the yttrium-barium-copper-oxide system (which is herein below abbreviated as "Y-Ba-Cu-O system"), the bismuth-strontium-calcium-copper-oxide system which is hereinbelow abbreviated as "Bi—Sr—Ca—Cu—O system"), and the thallium-bariumcalcium-copper-oxide system (which is hereinbelow abbreviated as "Tl—Ba—Ca—Cu—O system "). One of the attractive candidates for forming the superconductive oxide film is the co-sputtering technique where a plurality of targets of different substances are installed in the sputtering chamber and simultaneously sputtered to deposit a composite film of a superconductive oxide film.

For example, in order to form a superconductive oxide film in the Y—Ba—Cu—O system on a substrate by using the co-sputtering technique, three targets, namely, a metallic copper target, a $Y_2O_3$ target and a $BaCuO_2$ target are used for depositing the superconductive oxide film on the substrate disposed in facing relationship with the targets, and the composition of the superconductive oxide is adjustable by independently controlling the powers applied between the shield plates and the targets, respectively.

For formation of a superconductive oxide film in the Bi—Sr—Ca—Cu—O system by using the co-sputtering technique, the co-sputtering system requires another set of the targets, i.e., a metallic copper target, a metallic bismuth target and a $SrCaCu_2O_4$ target. These targets are subjected to bombardments of, for example, argon ions and, accordingly, sputtered to deposit the superconductive oxide film on a substrate.

In a similar manner, a metallic copper target, a $Tl_2O_3$ target and a $BaCaCu_2O_4$ target are installed in the sputtering chamber for formation of a superconductive oxide film in the Tl—Ba—Ca—Cu—O system, and these targets are simultaneously sputtered with the bombardments of the argon ions.

The above-mentioned $BaCuO_2$, $SrCaCu_2O_4$ and $BaCaCu_2O_4$ targets are produced through the following process sequences. The process sequences start with preparation of powders of barium carbonate, strontium carbonates, the calcium carbonate and copper oxide which are not greater than 10 microns in average diameter.

(1) Production of $BaCuO_2$ Target:

The powders of the barium carbonate and the copper oxide are regulated to a predetermined proportion and mixed into each other. The mixture is calcined at 850 to 950 degrees in centigrade for 10 hours, and the calcined product is pulverized. The calcination and the pulverization are repeated twice or three times to produce a powder of $BaCuO_2$. Subsequently, the powder of $BaCuO_2$ is formed into a target by using a hot-pressing technique under the following conditions:

Atmosphere: a reduced pressure of not greater than $10^{-2}$ torr

Heating temperature: 600 to 900 degrees in centigrade

Compacting pressure: 50 to 300 kgf/cm²

Heating time: 2 to 10 hours (2) Production of $SrCaCu_2O_4$ Target:

The powders of strontium carbonate, calcium carbonate and copper oxide are regulated to a predetermined proportion and mixed into one another. Then, the resulting mixture is calcined at 850 to 950 degrees in centigrade for a certain period of time, and the calcined product is pulverized. The calcination and the pulverization are repeated twice or three times to produce a powder of $SrCaCu_2O_4$. Subsequently, the powder of $SrCaCu_2O_4$ is formed into a target by using the hot-pressing technique under the similar conditions to the $BaCuO_2$ target.

(3) Production of $BaCaCu_2O_4$ Target

The powders of barium carbonate, calcium carbonate and copper oxide are regulated into a predetermined proportion and mixed into one another. Then, the resulting mixture is calcined at 850 to 950 degrees in centigrade for a certain period of time, and the calcined product is pulverized. The calcination and the pulverization are repeated twice or three times to produce a powder of $BaCaCu_2O_4$. Subsequently, the powder of $BaCaCu_2O_4$ is formed into a target by using the hot-pressing technique under the similar conditions to the $BaCuO_2$.

However, the prior art targets are merely composed of oxides such as $BaCuO_2$, $SrCaCu_2O_4$ and $BaCaCu_2O_4$, respectively, and, for this reason, a problem is encountered in each of the prior art targets in low thermal conductivity. A large difference in temperature takes place between the sputtered surface of the target and the cooled surface thereof exposed to the associated cooling system, so that cracks are liable to be produced in the target due to the thermal stress during the sputtering. The prior art target is thus short in service life, and the superconductive oxide film is large in the production cost.

Furthermore, these targets are too high in resistivity to be used in a DC diode sputtering system, and, accordingly, an RF sputtering system is required to deposit the superconductive oxide film. Since the RF sputtering system is complicated and, accordingly, more expensive than the DC sputtering system, the expensive system gives rise to increase the production cost of the superconductive oxide film.

Moreover, the prior art targets are low in mechanical strength and, accordingly, brittle, so that meticulous care is necessary for handling the prior art target. The prior art target is much liable to be broken due to careless handling and suffers from short service life. This also increases the production cost of the superconductive oxide film.

SUMMARY OF THE INVENTION

It is therefore an important object of the present invention to provide a target which is used in the co-sputtering system.

It is also an important object of the present invention to provide a target which is large in the thermal conductivity as well as the mechanical strength but small in the electrical resistivity, resulting in reduction in the production cost of the superconductive oxide film.

It is another important object of the present invention to provide a process of producing the target which is improved in thermal conductivity, resistivity and mechanical strength.

It is still another object of the present invention to provide a process of forming a superconductive oxide film on a substrate by using a co-sputtering technique using the improved target described above.

To accomplish these objects, the present invention proposes to disperse metallic copper over a complex oxide used for formation of the target.

In accordance with one aspect of the present invention, there is provided a target used for forming a thin film of a superconductive oxide, the target being formed of a composite material containing an oxygen compound and metallic copper ranging between about 5% and about 40% by volume, in which the superconductive oxide contains all of the elements of the complex oxide, and in which the metallic copper is dispersed throughout the complex oxide, wherein the oxygen compound contains alkaline earth metal, copper and oxygen.

The oxygen compound may be of a ternary compound containing barium, copper and oxygen represented by the molecular formula of $BaCuO_2$, a quaternary compound containing strontium, calcium, copper and oxygen represented by the molecular formula of $SrCaCu_2O_4$, or a quaternary compound containing barium, calcium, copper and oxygen represented by the molecular formula of $BaCaCu_2O_4$.

In accordance with another aspect of the present invention, there is provided a process of producing a target used for forming a superconductive oxide film, comprising the steps of: (a) preparing powders of ingredient compounds and metallic copper, the ingredient compounds containing alkaline earth metal, copper and oxygen; (b) mixing the powders into a predetermined proportion where the metallic copper falls within the range between about 5% and about 40% by volume; and (c) forming the mixed powders into a target. The mixed powders may be formed into a target by using hot pressing.

In accordance with still another aspect of the present invention, there is provided a process of forming a superconductive oxide film comprising the steps of: (a) preparing a DC sputtering system, a substrate, and targets, one of which is made of an oxygen compound containing metallic copper ranging between about 5% and about 40% by volume, the oxygen compound containing alkaline earth metal, copper and oxygen, the metallic copper being dispersed throughout aforesaid one of the targets; (b) placing the targets on target retainers of the DC sputtering system, respectively, in such a manner as to be spaced apart from the substrate on a substrate holder of the DC sputtering system by a certain distance; (c) simultaneously sputtering the targets to deposit a thin film of a complex oxide on the substrate; and (d) annealing the thin film in a high temperature ambient.

BRIEF DESCRIPTION OF THE DRAWINGS

The features and advantages of a target, a process of producing the target and a process of forming a superconductive oxide film with the target according to the present invention will be more clearly understood from the following description taken in conjunction with the accompanying drawings in which.

DESCRIPTION OF THE PREFERRED EMBODIMENTS

Figure 1:
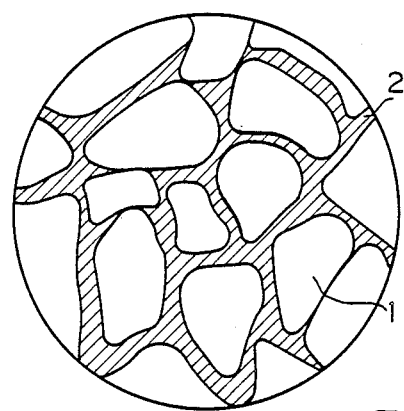
FIG. 1 is a schematic view of a micrograph showing the structure of a target according to the present invention.

In accordance with the present invention, various targets are provided for a co-sputtering system. Each of the targets is formed of a composite material containing metallic copper ranging from about 5% to about 40% by volume and an oxygen compound of about 60% to about 95% by volume. The oxygen compound is selected from the group consisting of substances represented by the molecular formulae of $BaCuO_2$, $SrCaCu_2O_4$ and $BaCaCu_2O_4$, respectively. If the metallic copper content is less than 5% by volume, the desired thermal conductivity, resistivity and mechanical strength can not be achieved. On the other hand, if the metallic copper content is more than 40% by volume, the superconductive oxide contains too much copper to have the composition appropriate for achievement of a high critical temperature. The compound oxide is uniformly dispersed in metalic cooper as shown in FIG. 1, wherein reference numeral 1 designates the oxygen compound, and reference numeral 2 designates metallic copper.

Each of the targets is advantageously produced by mixing about 5% to about 40% by volume of metallic copper with about 60 to about 95% by volume of each oxygen compound described above, followed by the hot-pressing in a vacuum ambient at about 600 degrees to about 900 degrees in centigrade under a compacting pressure of about 50 kgf/cm$^2$ to about 300 kgf/cm$^2$. Various targets are produced through the process sequence, and miscellaneous substances may be contained in the targets.

Figure 2:
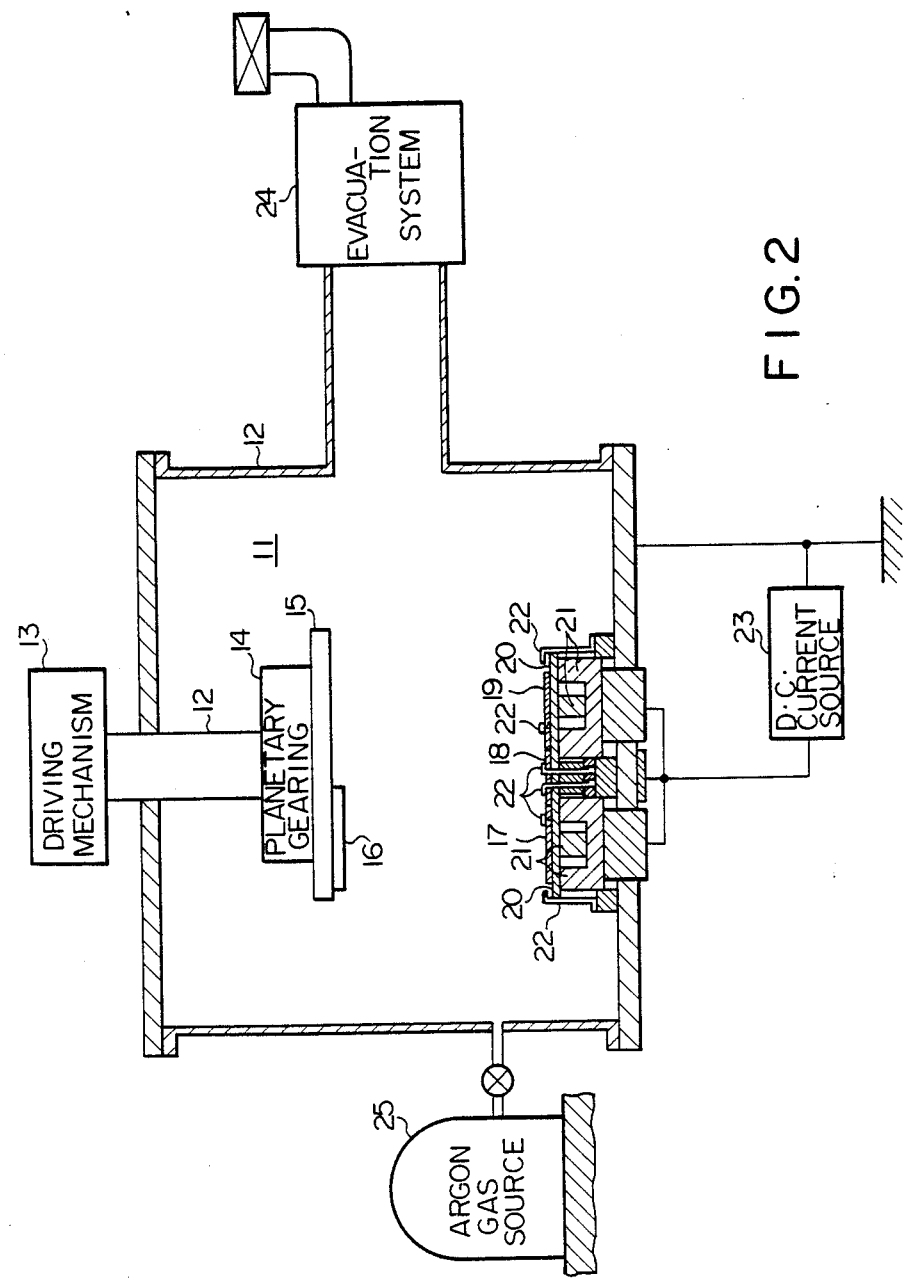
FIG. 2 is a schematic sectional view showing a co-sputtering system used in the process according to the present invention.

Each of the targets thus prepared is used for forming a superconductive oxide film on a substrate placed in a co-sputtering system exemplified in FIG. 2. Referring to FIG. 2, reference numeral 11 designates a sputtering chamber defined by walls 12. A driving shaft 12 projects from the outside of the chamber 11 and is coupled at one end thereof to a driving mechanism 13 and at the other end thereof to a planetary gearing 14. The planetary gearing 14 is provided in association with a substrate holder 15 where a substrate 16 is disposed. The substrate 16 thus disposed on the holder 15 not only revolves on the center axis thereof but also turns around the center axis of the driving shaft 12 through the orbital motion. The dual motions are conducive to a uniform composition of a thin film deposited on the substrate 16.

In the sputtering chamber 11 is further provided three sets of target retainers where three targets 17, 18 and 19 are respectively fixed. Each of the target retainers is constituted by a backing plate 20, a magnet unit 21 attached to the backing plate 20 and an earth shield member 22, and the backing plate 20 and the magnet unit 21 as a whole provide a conduit where a coolant passes. A D.C. current source 23 is coupled between the earth shield members 22 and the backing plates 20 in a parallel manner, and the earth shield members 22 are further grounded. By virtue of this coupling, the earth shield members 22 are fixed to the ground voltage level, and a negative voltage level is supplied to the backing plates 20 and, accordingly, to the targets 17 to 19. The target retainers thus arranged are located in such a manner as to face to an area defined by the orbit on which the substrate 16 turns. Therefore, the substrate successively passes through respective fluxes of sputtered particles from the targets 17 to 19. The sputtering chamber 11 is coupled to an evacuation system 24 so as to create a vacuum ambient, and an argon gas source 25 is conducted to the sputtering chamber 11 for supplying an argon gas. The argon gas may be replaced with a gaseous mixture of argon and oxygen.

In the co-sputtering process, the target 17 of the present invention as well as two other kinds of targets 18 and 19 are fixed to the target retainers, respectively, and the substrate 16 is placed on a suitable position on the substrate holder 15 at a predetermined distance from the targets 17, 18 and 19. The sputtering chamber 11 is then evacuated by using the evacuation system 24, and charged with the argon gas or a gaseous mixture of argon and oxygen supplied from the gas source 25. Thereafter, a predetermined difference in voltage level is applied between the earth shield plates 22 and the targets 17, 18 and 19, then the argon gas is ionized by the agency of an electric field produced around the targets 17 to 19, and the argon ions are directed to the targets 17 to 19, respectively. When the targets 17 to 19 are respectively subjected to bombardments of the argon ions, the targets 17 to 19 are simultaneously sputtered to produce the fluxes of the particles, and the fluxes are successively fallen onto the substrate 16 driven for rotation. The particles of the fluxes are deposited on the substrate 16, and the substrate 16 is finally covered with a complex oxide which is annealed in the later stage. The complex oxide thus produced shows the superconductivity at a relatively high critical temperature.

The present invention is further described in detail by the following examples.

Target of BaCuO2

The powder of $BaCuO_2$ is produced through the process sequence used in the formation of the prior art target, and the powder is about 5 microns in average diameter. Another powder of metallic copper is further prepared for formation of a target according to the present invention. The powder of the metallic powder is about 99.999% in purity and about 18.0 microns in average diameter.

Both of the powders are regulated to respective proportions indicated in Table 1, and these regulated powders are mixed into each other by using a rotary ball mill for 30 minutes. Then, mixtures 1 to 7 are formed for the subsequent stage. Each of the resulting mixtures is confined in an internal space of a mold, and the internal space is initially about 5 centimeters in diameter and about 3.0 centimeters in thickness. The mixtures are subjected to hot pressing under the following conditions to produce targets each measuring about 5 centimeters in diameter and about 0.4 centimeter in thickness:

Atmosphere: a reduced pressure of about $10^{-2}$ torr
Heating temperature: about 850 degrees in centigrade
Compacting pressure: about 200 $kgf/cm^2$
Heating time period: about 4 hours The targets produced from the mixtures 1 to 7 are hereinbelow referred to as "targets 1 to 7", respectively. The thermal conductivity, the electrical resistivity and the mechanical strength are measured for the respective targets thus produced, and the results are shown in Table 2. The thermal conductivity is used for evaluation of a cooling efficiency, and the mechanical strength is represented by the flexural strength.

Subsequently, the surface of the target 4 is buffed and, then, observed with an optical microscope. The surface is sketched through the optical microscope as illustrated in FIG. 1. As will be seen from FIG. 1, the oxygen compound $BaCuO_2$ is uniformly dispersed in the metallic copper 2.

After the above measurements and observation, the targets 1 to 7 are respectively co-sputtered together with a metallic copper target and an yttria target $Y_2O_3$ both adjusted to be equal in size to the targets 1 to 7, and the co-sputterings are carried out in the following circumstances to deposit thin films of respective complex oxides to a thickness of about 0.7 microns:

Total pressure of atmosphere: about 20 milli-torr;
Atmosphere: gaseous mixture of argon and oxygen mixed in the proportion of 3:1;
Electric power: about 50 W;
Substrate used: MgO single-crystalline substrate;
Heating temperature of substrate: about 700 degrees in centigrade;
Sputtering time: about 2 hours.

The reason why the metallic copper target participates in the co-sputtering is that excess copper atoms are needed to adjust the composition of the complex oxide to a desirable proportion due to the reverse sputtering phenomenon.

Each thin film thus deposited is annealed in the atmospheric air at about 850 degrees in centigrade for about 1.0 hour, followed by gradual cooling in the furnace. The critical temperature (Tc) of each film is thereafter measured by using the four probe method. The results are also shown in Table 2.

The mixtures 3 to 6 and, accordingly, the targets 3 to 6 fall within the scope of the present invention, however, targets 1, 2 and 7 are out of the scope of the present invention because of the metallic copper contents. As will be understood from Table 2, the thermal conductivity, the electric resistivity and the mechanical strength are improved without any sacrifice of the critical temperature in so far as the copper contents fall within the range between about 5% and about 40% by volume.

TABLE 1

| Mixture No. | Composition of powders (% by volume) | |
|---|---|---|
| | $BaCuO_2$ powder | Metallic Cu powder |
| 1 | 100 | — |
| 2 | 98 | 2 |
| 3 | 95 | 5 |
| 4 | 90 | 10 |
| 5 | 80 | 20 |
| 6 | 60 | 40 |
| 7 | 50 | 50 |

(blank)

TABLE 2

| Target No. | Thermal conductivity (cal/cm × sec. × deg. C) | Resistivity (ohm × cm) | Mechanical strength ($kg/cm^2$) | Critical temp. of film (deg. K) |
|---|---|---|---|---|
| 1 | 0.01 | >$10^4$ | 73 | 78 |
| 2 | 0.01 | >$10^4$ | 65 | 80 |
| 3 | 0.08 | $30 \times 10^{-6}$ | 121 | 83 |
| 4 | 0.11 | $15 \times 10^{-6}$ | 130 | 85 |

TABLE 2-continued

| Target No. | Thermal conductivity (cal/cm × sec. × deg. C) | Resistivity (ohm × cm) | Mechanical strength (kg/cm$^2$) | Critical temp. of film (deg. K) |
| --- | --- | --- | --- | --- |
| 5 | 0.25 | 8 × 10$^{-6}$ | 132 | 82 |
| 6 | 0.23 | 3 × 10$^{-6}$ | 145 | 73 |
| 7 | 0.35 | 2 × 10$^{-6}$ | 150 | 45 |

SrCaCu2O4 Target

The powder of the oxygen compound represented by the molecular formula of SrCaCu$_2$O$_4$ is prepared through the process sequence described in connection with the prior art target, and the powder of metallic copper is also prepared for production of targets according to the present invention. The powder of the oxygen compound is about 5 microns in average diameter, and the metallic copper powder is about 18.0 microns in average diameter. These powders are regulated to respective proportions indicated in Table 3 and then mixed into each other by using a rotary ball mill for about 30 minutes to produce mixtures represented by numbers 8 to 14, respectively. The mixtures 8 to 14 are hot-pressed in the similar manner to the mixtures 1 to 7, and targets 8 to 14 are respectively produced from the mixtures 8 to 14. Each of the targets 8 to 14 is about 5 centimeters in diameter and about 0.4 centimeter thick. The thermal conductivity, the electrical resistivity and the mechanical strength are measured for the respective targets 8 to 14 thus produced, and the results are shown in Table 4. The thermal conductivity is used for evaluation of a cooling efficiency, and the mechanical strength is represented by the flexural strength.

Subsequently, the surface of the target 11 is buffed and, then, observed with an optical microscope. The similar surface to that illustrated in FIG. 1 are observed. This means that the compound SrCaCu$_2$O$_4$ is uniformly dispersed in the metallic copper.

The targets 8 to 14 are respectively co-sputtered together with a metallic copper target and a metallic bismuth target both adjusted to be equal in size to the targets 8 to 14, and the co-sputterings are carried out in the similar circumstances to the targets 1 to 7. The thin films are about 0.7 micron thick.

Each thin film thus deposited is annealed in the atmospheric air at about 850 degrees in centigrade for about 100 hours, followed by gradual cooling in the furnace. The critical temperature (Tc) of each film is thereafter measured by using the four probe method. The results are also shown in Table 4.

The mixtures 8,9 and 14 and, accordingly, the targets 8, 9 and 14 are out of the scope of the present invention, because of the metallic copper contents. As will be understood from Table 4, the thermal conductivity, the electric resistivity and the mechanical strength are improved without any sacrifice of the critical temperature in so far as the copper contents which fall within the range between about 5% and about 40% by volume.

TABLE 3

| Mixture No. | Composition of powders (% by volume) | |
| --- | --- | --- |
| | SrCaCu$_2$O$_4$ powder | Metallic Cu powder |
| 8 | 100 | — |
| 9 | 98 | 2 |
| 10 | 95 | 5 |
| 11 | 90 | 10 |
| 12 | 80 | 20 |
| 13 | 60 | 40 |
| 14 | 50 | 50 |

TABLE 4

| Target No. | Thermal conductivity (cal/cm × sec. × deg. C) | Resistivity (ohm × cm) | Mechanical strength (kg/cm$^2$) | Critical temp. of film (deg. K) |
| --- | --- | --- | --- | --- |
| 8 | 0.01 | >10$^4$ | 79 | 99 |
| 9 | 0.01 | >10$^4$ | 73 | 103 |
| 10 | 0.08 | 45 × 10$^{-6}$ | 113 | 102 |
| 11 | 0.15 | 23 × 10$^{-6}$ | 108 | 106 |
| 12 | 0.20 | 7 × 10$^{-6}$ | 137 | 102 |
| 13 | 0.30 | 4 × 10$^{-6}$ | 155 | 90 |
| 14 | 0.38 | 2 × 10$^{-6}$ | 150 | 73 |

BaCaCu2O4 Target

The powder of the oxygen compound represented by the molecular formula of BaCaCu$_2$O$_4$ is prepared through the process sequence described in connection with the prior art target, and the powder of metallic copper is also prepared for production of targets according to the present invention. The powder of the oxygen compound is about 5 microns in average diameter, and the metallic copper powder is about 18.0 microns in average diameter. These powders are regulated to respective proportions indicated in Table 5 and then mixed into each other by using a rotary ball mill for about 30 minutes to produce mixtures represented by numbers 15 to 21, respectively. The mixtures 15 to 21 are hot-pressed in the similar manner to the mixtures 1 to 7, and targets 15 to 21 are respectively produced from the mixtures 15 to 21. Each of the targets 15 to 21 is about 5 centimeters in diameter and about 0.4 centimeter thick.

The thermal conductivity, the electrical resistivity and the mechanical strength are measured for the respective targets 15 to 21 thus produced, and the results are shown in Table 6. The thermal conductivity is used for evaluation of a cooling efficiency, and the mechanical strength is represented by the flexural strength.

Subsequently, the surface of the target 18 is observed with an optical microscope, and it is confirmed that the compound BaCaCu$_2$O$_4$ is uniformly dispersed in the metallic copper.

The targets 15 to 21 are respectively co-sputtered together with a metallic copper target and a thallium oxide target both adjusted to be equal in size to the targets 15 to 21, and the co-sputterings are carried out in the similar circumstances to the targets 1 to 7. The thin films are about 0.7 micron thick.

Each thin film thus deposited is annealed in the atmospheric air at about 850 degrees in centigrade for about 1.0 hours, followed by gradual cooling in the furnace. The critical temperature (Tc) of each film is thereafter measured by using the four probe method. The results are also shown in Table 6.

The mixtures 15, 16 and 21 and, accordingly, the targets 15, 16 and 21 are out of the scope of the present invention because of the metallic copper contents. As will be understood from Table 6, the thermal conductivity, the electric resistivity and the mechanical strength are improved without any sacrifice of the critical temperature in so far as the copper contents which fall within the range between about 5% and about 40% by volume.

TABLE 5

| Mixture No. | Composition of powders (% by volume) | |
|---|---|---|
| | $BaCaCu_2O_4$ powder | Metallic Cu powder |
| 15 | 100 | — |
| 16 | 98 | 2 |
| 17 | 95 | 5 |
| 18 | 90 | 10 |
| 19 | 80 | 20 |
| 20 | 60 | 40 |
| 21 | 50 | 50 |

(blank)

TABLE 6

| Target No. | Thermal conductivity (cal/cm × sec. × deg. C) | Resistivity (ohm × cm) | Mechanical strength (kg/cm$^2$) | Critical temp. of film (deg. K) |
|---|---|---|---|---|
| 15 | 0.01 | >10$^4$ | 77 | 107 |
| 16 | 0.01 | >10$^4$ | 68 | 110 |
| 17 | 0.10 | 40 × 10$^{-6}$ | 122 | 113 |
| 18 | 0.13 | 25 × 10$^{-6}$ | 137 | 120 |
| 19 | 0.24 | 13 × 10$^{-6}$ | 143 | 115 |
| 20 | 0.32 | 3 × 10$^{-6}$ | 160 | 101 |
| 21 | 0.41 | 2 × 10$^{-6}$ | 145 | 85 |

By virtue of the present invention, the targets containing the metallic copper between about 5% and about 40% by volume are improved in the thermal conductivity, and, for this reason, cracks are less liable to take place in the targets. The electric resistivity is decreased by the agency of the metallic copper, so that each of the targets is usable in a DC co-sputtering system. Since the mechanical strength is increased, the target according to the present invention is less liable to be broken due to a careless handling by the operator. These advantages result in reduction in the production cost of a thin film of a superconductive oxide.

What is claimed is:

1. A target used for forming a thin film of a superconductive oxide, said target being formed of a composite material containing an oxygen compound and metallic copper ranging between about 5% and about 40% by volume, in which said superconductive oxide contains all of the elements of said oxygen compound, and in which said metallic copper is dispersed throughout said oxygen compound, wherein said oxygen compound contains alkaline earth metal, copper and oxygen.

2. A target as set forth in claim 1, in which said oxygen compound is of a ternary compound containing barium, copper and oxygen.

3. A target as set forth in claim 2, in which said ternary compound is represented by the molecular formula of $BaCuO_2$.

4. A target as set forth in claim 1, in which said oxygen compound is of a quaternary compound containing strontium, calcium, copper and oxygen.

5. A target as set forth in claim 4, in which said quaternary compound is represented by the molecular formula of $SrCaCu_2O_4$.

6. A target as set forth in claim 1, in which said oxygen compound is of a quaternary compound containing barium, calcium, copper and oxygen.

7. A target as set forth in claim 6, in which said quaternary compound is represented by the molecular formula of $BaCaCu_2O_4$.

8. A process of producing a target used for forming a superconductive oxide film, comprising the steps of:

(a) preparing powders of ingredient compounds and metallic copper, said ingredient compounds containing alkaline earth metal, copper and oxygen;

(b) mixing said powders into a predetermined proportion where said metallic copper falls within the range between about 5% and about 40% by volume; and (c) forming said mixed powders into a target.

9. A process of producing a target as set forth in claim 8, in which said ingredient compounds are a barium carbonate and a copper oxide.

10. A process of producing a target as set forth in claim 8, in which said ingredient compounds are a strontium carbonate, a calcium carbonate and a copper oxide.

11. A process of producing a target as set forth in claim 8, in which said ingredient compounds are a barium carbonate, a calcium carbonate and a copper oxide.

12. A process of producing a target as set forth in claim 8, in which said mixed powders are formed into a target by using a hot pressing.

13. A process of forming a superconductive oxide film comprising the steps of:

(a) preparing a DC sputtering system, a substrate, and targets one of which is made of an oxygen compound containing metallic copper ranging between about 5% and about 40% by volume, said oxygen compound containing alkaline earth metal, copper and oxygen, said metallic copper being dispersed throughout said one of the targets;

(b) placing said targets on target retainers of said DC sputtering system, respectively, in such a manner as to be spaced apart from said substrate on a substrate holder of said DC sputtering system by a certain distance;

(c) simultaneously sputtering said targets to deposit a thin film of a complex oxide on said substrate; and (d) annealing said thin film.

14. A process of forming a superconductive oxide as set forth in claim 13, in which said targets are respectively formed of a barium copper oxide dispersed in said metallic copper, a yttria and metallic copper.

15. A process of forming a superconductive oxide as set forth in claim 14, in which said barium copper oxide and said yttria are respectively represented by the molecular formulae of $BaCuO_2$ and $Y_2O_3$.

16. A process of forming a superconductive oxide as set forth in claim 13, in which said targets are respectively formed of a strontium calcium copper oxide dispersed in said metallic copper, metallic copper and metallic bismuth.

17. A process of forming a superconductive oxide as set forth in claim 16, in which said strontium calcium copper oxide is represented by the molecular formula of $SrCaCu_2O_4$.

18. A process of forming a superconductive oxide as set forth in claim 13, in which said targets are respectively formed of a barium calcium copper oxide dispersed in said metallic copper, a thallium oxide and metallic copper.

19. A process of forming a superconductive oxide as set forth in claim 18, in which said barium calcium copper oxide and said thallium oxide are respectively represented by the molecular formulae of $BaCaCu_2O_4$ and $Tl_2O_3$.

20. A process of forming a superconductive oxide as set forth in claim 13, in which said substrate revolves around the center axis thereof in an orbital motion of said substrate holder while said thin film is deposited on the substrate.

* * * * *